United States Patent
Araki

(10) Patent No.: US 11,152,741 B2
(45) Date of Patent: Oct. 19, 2021

(54) CONNECTOR AND CONDUCTION PATH

(71) Applicant: SUMITOMO WIRING SYSTEMS, LTD., Yokkaichi (JP)

(72) Inventor: Yusuke Araki, Yokkaichi (JP)

(73) Assignee: SUMITOMO WIRING SYSTEMS, LTD., Yokkaichi (JP)

( * ) Notice: Subject to any disclaimer, the term of this patent is extended or adjusted under 35 U.S.C. 154(b) by 0 days.

(21) Appl. No.: 16/770,039

(22) PCT Filed: Dec. 5, 2018

(86) PCT No.: PCT/JP2018/044659
§ 371 (c)(1),
(2) Date: Jun. 10, 2020

(87) PCT Pub. No.: WO2019/111923
PCT Pub. Date: Jun. 13, 2019

(65) Prior Publication Data
US 2020/0313344 A1 Oct. 1, 2020

(30) Foreign Application Priority Data

Dec. 8, 2017 (JP) .............................. JP2017-236097

(51) Int. Cl.
*H01R 4/64* (2006.01)
*H01R 13/52* (2006.01)
*H05K 7/20* (2006.01)

(52) U.S. Cl.
CPC ..... *H01R 13/5208* (2013.01); *H01R 13/5202* (2013.01); *H05K 7/20127* (2013.01); *H01R 2201/26* (2013.01)

(58) Field of Classification Search
CPC .............. H01R 13/523; H01R 13/5227; H01R 13/5219; H01R 13/6275; H01R 13/6272;
(Continued)

(56) References Cited

U.S. PATENT DOCUMENTS 3,953,099 A * 4/1976 Wilson .................. H01R 13/50
439/205
5,857,863 A * 1/1999 Onizuka ............. B60R 16/0207
439/248
(Continued)

FOREIGN PATENT DOCUMENTS

JP S56-42110 B2 10/1981
JP 2000-228243 A 8/2000
(Continued)

OTHER PUBLICATIONS

Yazaki Corporation. CD-ROM of the specification and drawings annexed to the request of Japanese Utility Model Application No. 122/1996 (Laid-open No. 1255/1996). Aug. 9, 1996.
(Continued)

*Primary Examiner* — Thanh Tam T Le
(74) *Attorney, Agent, or Firm* — Loza & Loza, LLP

(57) ABSTRACT

This connector is provided with: an apparatus-side connector (70) attached to an apparatus having a case (90); and a wire-side connector (20) to which a protective pipe (11) that protects a wire (10) is attached. A through hole (27) is formed inside the wire-side connector (20). A through hole (78) is formed inside the apparatus-side connector (70). When the wire-side connector (20) and the apparatus-side connector (70) are normally fitted, an air passage (60) communicating the inner space (S2) of the case (90) of the apparatus and the inner space (S1) of the protective pipe (11) through the through hole (27) and the through hole (78) is formed inside the wire-side connector (20) and the apparatus-side connector (70).

12 Claims, 9 Drawing Sheets

(58) Field of Classification Search
CPC ............ H01R 13/6215; H01R 13/5202; H01R 13/4223; H01R 23/7073
USPC ....... 439/205, 206, 271, 345, 352, 357, 362, 439/364, 559, 595, 660
See application file for complete search history.

(56) References Cited

U.S. PATENT DOCUMENTS

| | | | | |
|---|---|---|---|---|
| 5,885,107 | A * | 3/1999 | Sluss | H01R 13/6315 439/595 |
| 6,558,178 | B2 | 5/2003 | Nakamura | H01R 13/5221 439/271 |
| 6,739,888 | B2 * | 5/2004 | Kato | B60L 3/00 439/157 |
| 6,835,094 | B2 * | 12/2004 | Matsushita | H01R 13/5202 439/271 |
| 6,840,789 | B2 * | 1/2005 | Shibata | H01R 13/5202 439/345 |
| 7,611,370 | B2 * | 11/2009 | Ito | H01R 13/6272 439/345 |
| 7,785,145 | B2 * | 8/2010 | Menez | H01R 13/5219 439/587 |
| 8,011,977 | B2 * | 9/2011 | Tsuruta | H01R 13/4365 439/752 |
| 8,029,305 | B2 * | 10/2011 | Tanaka | H01R 13/193 439/345 |
| 8,137,123 | B2 * | 3/2012 | Sakamoto | H01R 13/4223 439/345 |
| 8,167,653 | B2 * | 5/2012 | Hasegawa | H01R 13/74 439/607.41 |
| 8,241,062 | B2 * | 8/2012 | Tsuruta | H01R 13/506 439/589 |
| 8,257,107 | B2 * | 9/2012 | Tsuruta | H01R 13/6581 439/362 |
| 8,366,472 | B2 * | 2/2013 | Miyamoto | H01R 13/506 439/345 |
| 8,491,323 | B2 * | 7/2013 | Ishibashi | H01R 13/5221 439/205 |
| 8,491,344 | B2 * | 7/2013 | Ishibashi | H01R 13/4223 439/752.5 |
| 9,087,620 | B2 * | 7/2015 | Adachi | H05K 9/0098 |
| 9,302,635 | B2 * | 4/2016 | Han | H02G 15/013 |
| 9,376,069 | B2 * | 6/2016 | Nakai | B60R 16/0222 |
| 9,407,049 | B2 * | 8/2016 | Ishibashi | H01R 13/748 |
| 2015/0101842 | A1 | 4/2015 | Han et al. | |
| 2015/0318679 | A1 | 11/2015 | Nakai et al. | |

FOREIGN PATENT DOCUMENTS

| | | |
|---|---|---|
| JP | 2004-273391 A | 9/2004 |
| JP | 2005-158447 A | 6/2005 |
| JP | 2013-67254 A | 4/2013 |

OTHER PUBLICATIONS

Honda Tsushin Kogyo Co., Ltd. Microfilm of the specification and drawings annexed to the request of Japanese Utility Model Application No. 127831/1985 (Laid-open No. 38032/1987). Mar. 6, 1987.
PCT/JP2018/044659. International Search Report & Written Opinion (dated Jun. 13, 2019). 11 Pages.

\* cited by examiner

CONNECTOR AND CONDUCTION PATH

BACKGROUND

Field of the Disclosure

The present disclosure relates to a connector and a conduction path.

Related Art

Conventionally, wires are covered by a protective tube for protection from water, dust, and the like. Wires are laid out in various forms. Thus, a protective tube is configured as a coupled body of various types of tubes having different structures. For example, a protective tube includes a pipe that protects an intermediate portion of the wires and a rubber water resistant cover that protects a portion between the pipe and a connector. The protective tube seals the portions between a connector at one end of the wires and a connector at the other end of the wires. The pressure inside a protective tube may increase due to a temperature change in the protective tube, a change in the atmospheric pressure, or the like. To limit such an increase in the pressure inside the protective tube, the water resistant cover includes a ventilation portion (refer to, for example, Japanese Laid-Open Patent Publication No. 2013-241143). Air flows between the inside and outside of the protective tube through the ventilation portion.

The arrangement of the ventilation portion in the water resistant cover may result in flying objects, which are lifted when the vehicle is traveling, to clog the ventilation portion thereby increasing the pressure inside the protective tube.

Accordingly, it is an object of the present invention to provide a connector and a conduction path that limits increases in the pressure inside the protective tube.

SUMMARY

To solve the above problem, a connector includes a device-side connector attached to a device, a wire-side connector attached to a protective tube that protects a wire, a first through hole formed inside the wire-side connector, a second through hole formed inside the device-side connector, and a ventilation passage that connects an inner space of the device and an inner space of the protective tube through the first through hole and the second through hole inside the power-side connector and the device-side connector when the wire-side connector and the device-side connector are finally fitted to each other.

With this structure, when the wire-side connector and the device-side connector are finally fitted to each other, the ventilation passage, which connects the inner space of the device and the inner space of the protective tube through the first through hole of the wire-side connector and the second through hole of the device-side connector, is formed inside the wire side connector and the device-side connector. Thus, even when the temperature increases inside the protective tube, the air inside the protective tube is released into the inner space of the device to limit increases in the pressure inside the protective tube. Further, the ventilation passage is formed inside the wire-side connector and the device-side connector. This avoids situations in which the ventilation passage is clogged by flying objects when the vehicle is traveling or dust that is suspended in the air. Accordingly, increases in the pressure inside the protective tube can be limited.

The connector and conduction path according to the present invention limits increases in the pressure inside the protective tube.

DETAILED DESCRIPTION

Embodiments will now be described with reference to the drawings. In the accompanying drawings, elements are illustrated for simplicity and may be partially exaggerated or omitted. Further, in the accompanying drawings, elements have not necessarily been drawn to scale.

A first embodiment will now be described with reference to FIGS. 1 to 7.

Figure 1:
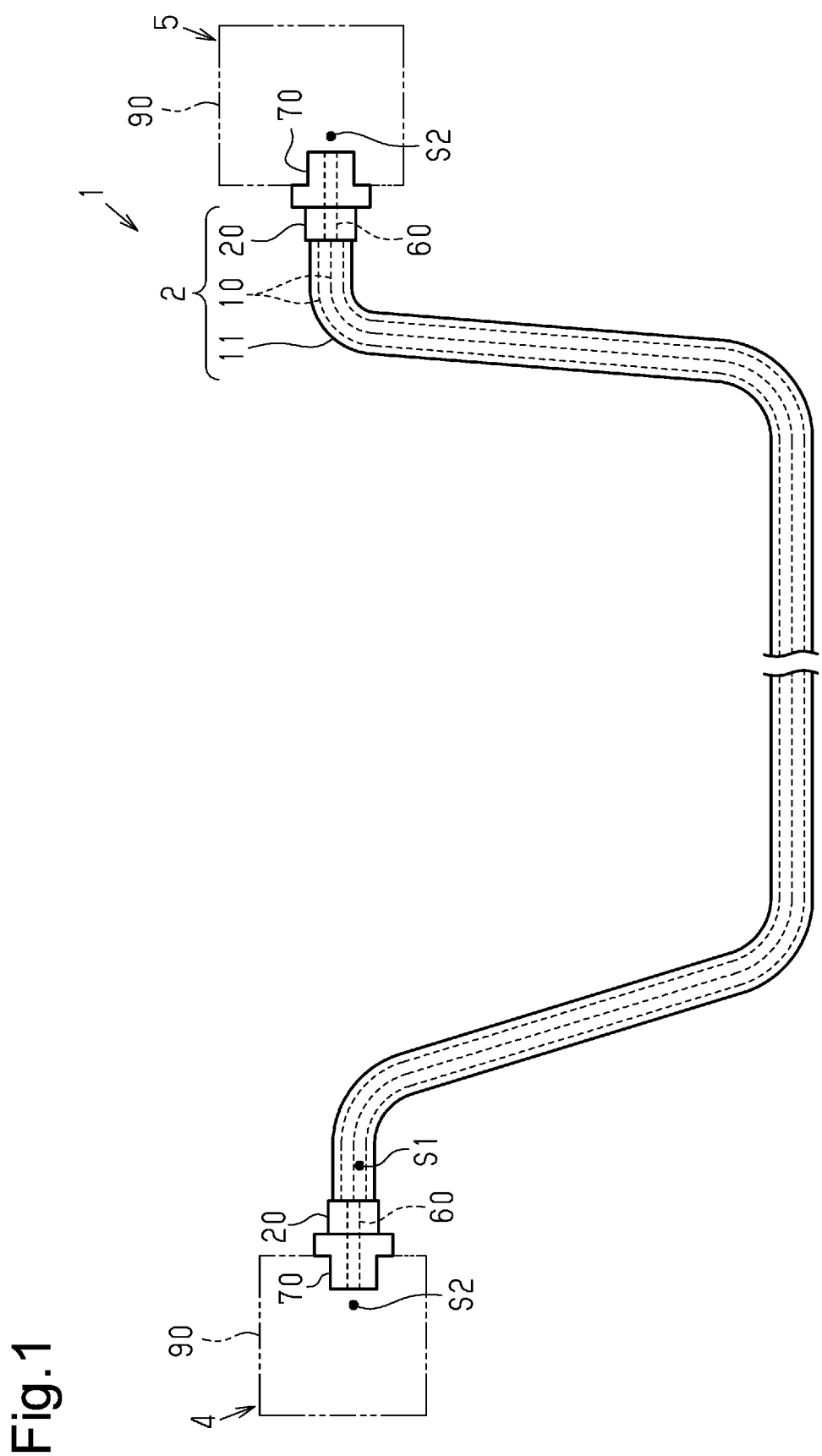
FIG. 1 is a schematic diagram illustrating a conduction path in accordance with a first embodiment.

FIG. 1 shows a conduction path 1 connecting two, three, or more electric devices (devices). The conduction path 1 includes a wire harness 2 and two device-side connectors 70 connected to the two ends of the wire harness 2. The conduction path 1 includes an inverter 4, which is arranged at, for example, a front part of a vehicle such as a hybrid vehicle or an electric vehicle, and a high-voltage battery 5, which is arranged toward the rear of the vehicle from the inverter 4. The conduction path 1 is laid out, for example, under the floor of the vehicle. The inverter 4 is connected to a wheel driving motor (not shown) that serves as a power source when the vehicle travels. The inverter 4 generates AC power from the DC power of the high-voltage battery 5 and supplies the AC power to the motor. The high-voltage battery 5 is, for example, a battery capable of supplying several hundred bolts of voltage.

The wire harness 2 includes a plurality of (two in the present embodiment) electric wires 10, two wire-side connectors 20 attached to the two ends of the electric wires 10, and a protective tube 11 surrounding all of the electric wires 10. One of the wire-side connectors 20 is connected to a device-side connector 70 attached to the inverter 4, and the other one of the wire-side connectors 20 is connected to a device-side connector 70 attached to the high-voltage battery 5. The protective tube 11 may be, for example, a metal or resin pipe, a flexible corrugated tube formed from resin or the like, a rubber water resistant cover, or a combination of these structures. The protective tube 11 protects, for example, the electric wires 10 accommodated therein from flying objects and liquid.

The device-side connectors 70 are fixed to cases 90 of the devices such as the inverter 4 and the high-voltage battery 5. The protective tube 11 is attached to each wire-side connector 20. Each wire-side connector 20 is fitted to the corresponding device-side connector 70 and electrically connected to the device-side connector 70. Further, each wire-side connector 20 is fixed to the corresponding case 90 in a state electrically connected to the device-side connector 70. A ventilation passage 60 is formed inside the wire-side connectors 20 and the device-side connectors 70 when the wire-side connectors 20 are finally fitted to the device-side connectors 70 to connect an inner space S1 of the protective tube 11 and an inner space S2 of each case 90. The case 90 is formed from, for example, metal. In the description hereafter, the frontward direction is defined as the direction in which each wire-side connector 20 is fitted to the corresponding device-side connector 70, which is fixed to the corresponding case 90.

The structure of the electric wires 10 will now be described with reference to FIG. 2.

Each electric wire 10 includes a conductive core wire and an insulative coating, which covers the outer surface of the core wire and is formed from a synthetic resin. Each electric wire 10 is, for example, a high-voltage electric wire applicable to high voltages and large currents. Each electric wire 10 is, for example, a non-shielded electric wire that does not have a shield structure. A rubber plug 12 is fitted onto an end of each electric wire 10. The rubber plug 12 is fitted onto, for example, the insulative coating located at the end of each electric wire 10. Each electric wire 10 has a terminal end connected by a female terminal metal fitting 21 to the wire-side connector 20.

The structure of the wire-side connector 20 will now be described.

The wire-side connector 20 includes the female terminal metal fittings 21, a wire-side connector housing 22, a rubber ring 23 fitted to the outer surface of the wire-side connector housing 22, and a shield shell 24.

The female terminal metal fittings 21 are respectively connected to the terminal ends of the electric wires 10. Each female terminal metal fitting 21 has, for example, a substantially cylindrical form. The female terminal metal fitting 21 includes a tubular connection portion 21A and a barrel 21B located rearward from the tubular connection portion 21A. The barrel 21B is crimped to the core wire of the corresponding electric wire 10 to electrically connect the female terminal metal fitting 21 and the electric wire 10.

The wire-side connector housing 22 has the form of a substantially oblong or substantially elliptic tube. The wire-side connector housing 22 is formed from, for example, synthetic resin. The wire-side connector housing 22 includes a plurality of tubular accommodation portions 25, a tubular portion 26, and a through hole 27, which is a hollow inside the tubular portion 26. The tubular accommodation portions 25 are arranged, for example, sandwiching two opposite sides of the tubular portion 26. The tubular accommodation portions 25 and the tubular portion 26 are molded as, for example, an integrated product.

The wire-side connector housing 22 has a central portion in a front-rear direction including a flange 30 extending radially outward from the entire outer surface in the circumferential direction. An accommodation groove 23A is formed frontward from the flange 30 in the wire-side connector housing 22 extending through the entire outer surface in the circumferential direction. The accommodation groove 23A is formed, for example, along the tubular accommodation portions 25 and the tubular portion 26. The rubber ring 23 is fitted to the accommodation groove 23A.

Figure 5:
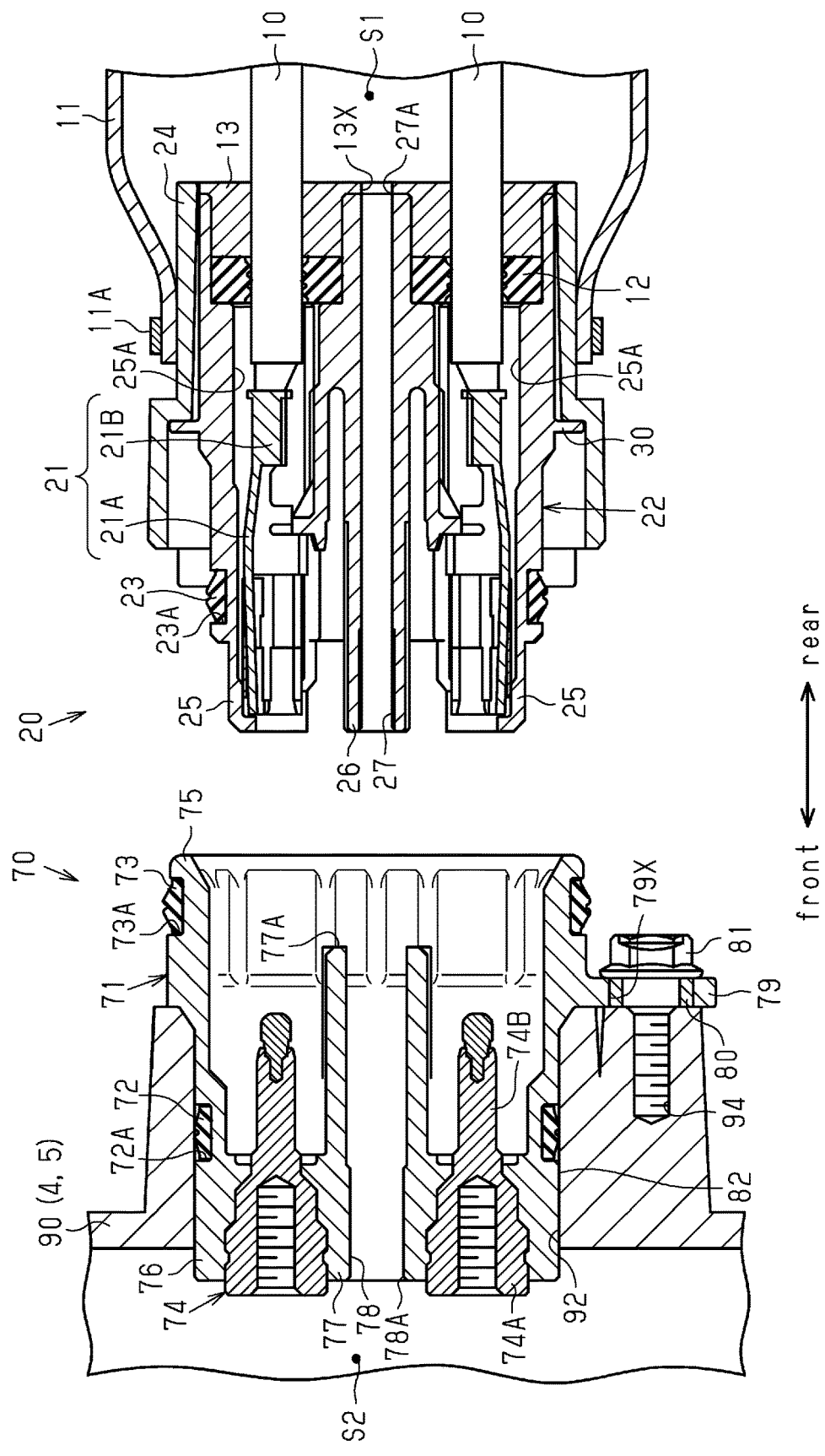
FIG. 5 is a cross-sectional view of the wire-side connector and the device-side connector in accordance with the first embodiment.

As shown in FIG. 5, each tubular accommodation portion 25 has a hollow internal structure with two open ends. Each tubular accommodation portion 25 has, for example, a substantially cylindrical form. A cavity 25A extends in the front-rear direction inside each tubular accommodation portion 25. Each cavity 25A extends, for example, through the wire-side connector housing 22 in the front-rear direction.

For example, the female terminal metal fitting 21, which is connected to the corresponding electric wire 10, is inserted from the rear opening into the cavity 25A of the corresponding tubular accommodation portion 25. When the female terminal metal fitting 21 is accommodated in the cavity 25A, the rubber plug 12 fitted to the electric wire 10 comes into close contact with the wall surface of the cavity 25A. The rubber plug 12 prevents the entrance of water between the outer surface of the electric wire 10 and the wall surface of the cavity 25A. A retainer 13 is fitted to the electric wire 10 at the rear of the rubber plug 12. The retainer 13 includes a through hole 13X at a position opposing the tubular portion 26. The through hole 13X extends through the retainer 13 in the front-rear direction. The through hole 13X is connected to the through hole 27 of the tubular portion 26. The through hole 13X has the form of, for example, a substantially square post.

The tubular portion 26 has a hollow internal structure with two open ends. The tubular portion 26 has, for example, the form of a substantially square tube.

The through hole 27 extends in the front-rear direction (fitting direction of wire-side connector 20 and device-side connector 70) inside the tubular portion 26. The through hole 27 extends from the side of the inner space S1 of the protective tube 11 toward the side of the inner space S2 of the case 90. The through hole 27 has one end that is open toward the inner space S1 of the protective tube 11 and another end that is open toward the device-side connector 70. The through hole 27 extends through, for example, the wire-side connector housing 22 in the front-rear direction. The through hole 27 has the form of, for example, a substantially square post. The through hole 27 is connected to, for example, the through hole 13X of the retainer 13. The through hole 27 is connected by the through hole 13X to the inner space S1 of the protective tube 11. The through hole 27 of the present example is formed so that an open end 27A at the side of the inner space S1 of the protective tube 11 (rear side) is located toward the inner space S1 (rearward) from the rubber ring 23.

The open end of the through hole 27 has a smaller cross-sectional area than the open end of each tubular accommodation portion 25. This limits enlargement of the wire-side connector 20 even when the through hole 27 is arranged separately and independently from the tubular accommodation portions 25.

Figure 2:
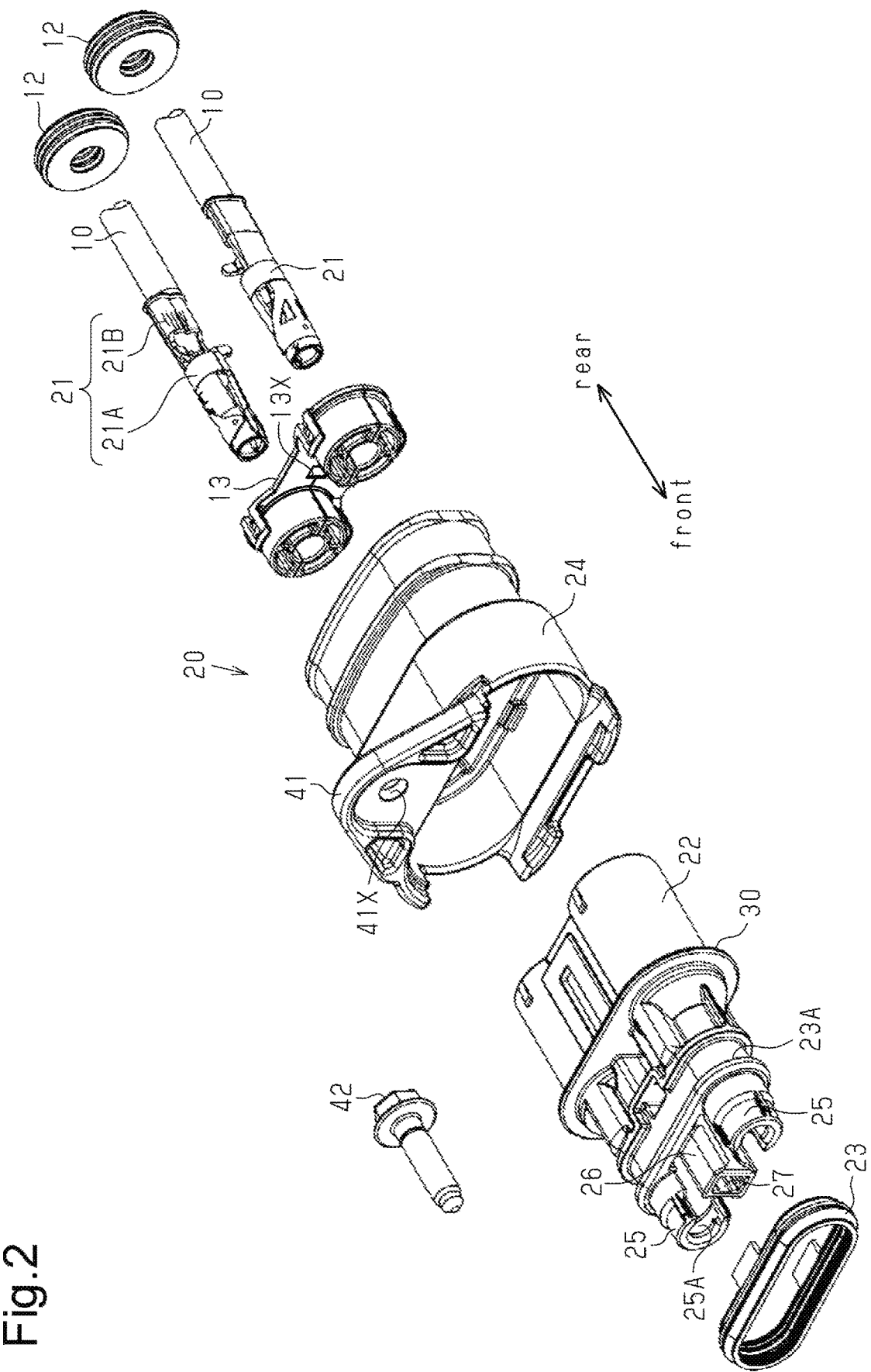
FIG. 2 is an exploded perspective view of a wire-side connector in accordance with the first embodiment.

As shown in FIG. 2, the shield shell 24 has the form of a substantially oblong or substantially elliptic tube. The shield shell 24 has front and rear ends that are both open. The shield shell 24 is formed to allow the wire-side connector housing 22 to be accommodated from, for example, the front opening. The shield shell 24 is formed from metal. The shield shell 24 is formed from, for example, aluminum or an aluminum alloy. The shield shell 24 is formed through, for example, die-casting.

Figure 3:
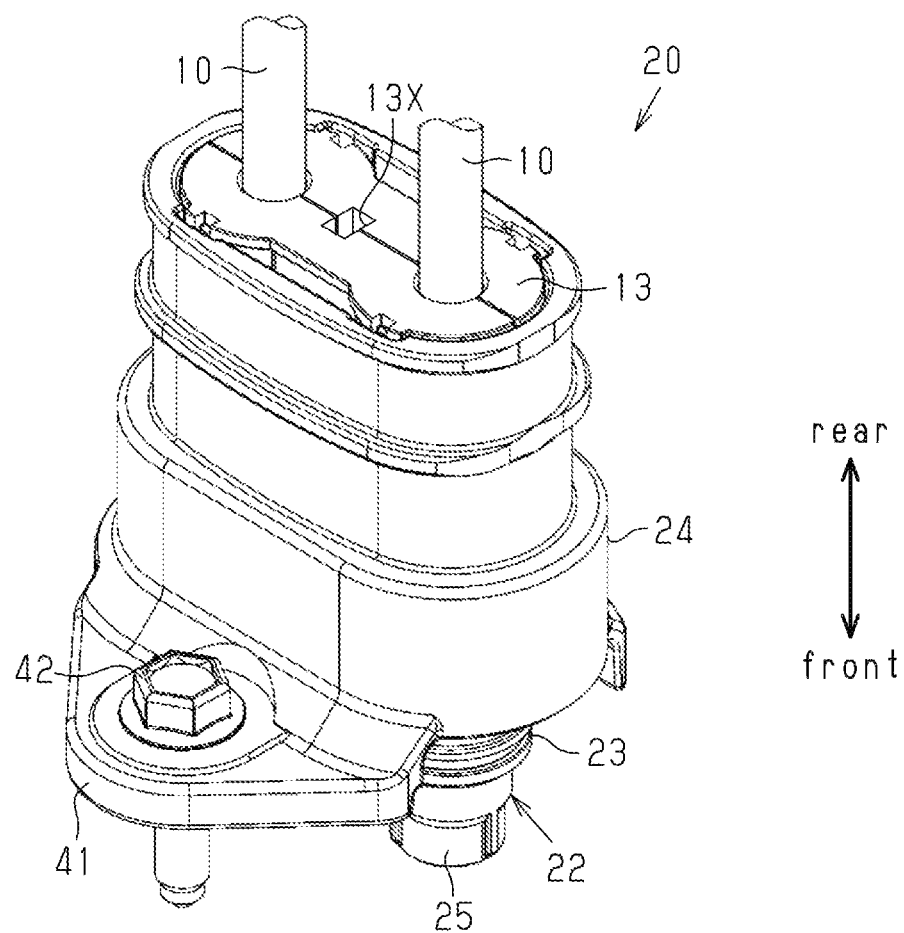
FIG. 3 is a perspective view of the wire-side connector in accordance with the first embodiment.

As shown in FIGS. 3 and 5, when the wire-side connector housing 22 is accommodated in the shield shell 24, the rubber ring 23 and the portion of the wire-side connector housing 22 frontward from the rubber ring 23 projects toward the front from the front open end of the shield shell 24.

As shown in FIGS. 2 and 3, a fastening portion 41 projects outward in the radial direction of the shield shell 24 from the outer surface at the front end of the shield shell 24. The fastening portion 41 substantially has the form of a plate. As shown in FIG. 2, a bolt insertion hole 41X extends through the fastening portion 41 in the plate-thickness direction (here, front-rear direction). A fastening bolt 42 is inserted through the bolt insertion hole 41X. The wire-side connector 20 is electrically connected to the device-side connector 70 and fixed to the case 90 by fastening the fastening bolt 42 to a bolt fastening hole (not shown) of the case 90. Further, the case 90 and the shield shell 24 are electrically connected by fastening the fastening bolt 42 to the bolt fastening hole (not shown) of the case 90.

The structure of the protective tube 11 will now be described.

As shown in FIG. 5, the protective tube 11 substantially has the form of a tube. The two ends of the protective tube 11 are respectively connected to the outer surfaces of the shield shells 24 of the two wire-side connectors 20. A tightening band 11A tightens and fixes the protective tube 11 to the outer surface of the shield shell 24 in an airtight manner. As a result, the inner space S1 of the protective tube 11 forms a sealed space between the two wire-side connectors 20. The electric wires 10 are all accommodated in the inner space S1. The inner space S1 is connected by the through hole 13X of the retainer 13 to the through hole 27 of each wire-side connector 20.

The structure of the device-side connector 70 will now be described.

Figure 4:
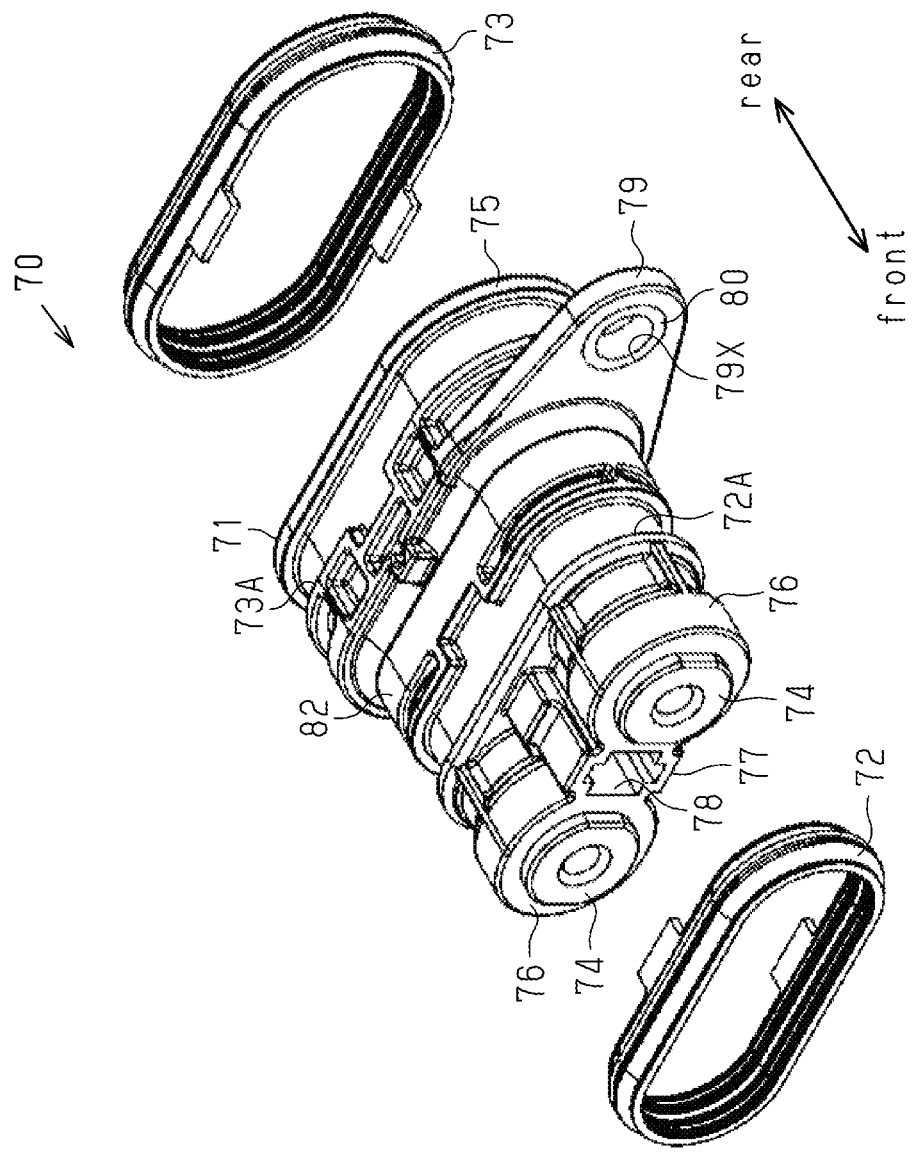
FIG. 4 is an exploded perspective view of a device-side connector in accordance with the first embodiment.

As shown in FIG. 4, the device-side connector 70 includes a device-side connector housing 71, a rubber ring 72 and a rubber ring 73 fitted to the outer surface of the device-side connector housing 71, and a plurality of male terminal metal fittings 74.

As shown in FIG. 5, the device-side connector 70 is attached to the case 90 of a device such as the inverter 4 or the high-voltage battery 5. The case 90 includes an attachment hole 92 to which part of the device-side connector 70 is fitted. Further, the case 90 includes a bolt fastening hole 94.

The device-side connector housing 71 includes a hood 75 that accommodates the tubular accommodation portions 25 and the tubular portion 26 of the wire-side connector housing 22 therein, a terminal holder 76 that holds the male terminal metal fittings 74, a tubular portion 77 arranged opposing the tubular portion 26, and a through hole 78 that is a hollow inside the tubular portion 77.

As shown in FIG. 4, the hood 75, for example, has a substantially oval contour and extends in the front-rear direction. A fastening portion 79 projects radially outward from the outer surface of the hood 75. The fastening portion 79 substantially has the form of a plate. A bolt insertion hole 79X extends through the fastening portion 79 in the plate-thickness direction (front-rear direction).

As shown in FIG. 5, a metal collar 80, which allows for insertion of a fastening bolt 81, is incorporated in the bolt insertion hole 79X. The device-side connector housing 71 is fixed to the case 90 by fastening the fastening bolt 81 to the bolt fastening hole 94 of the case 90.

The portion of the device-side connector housing 71 frontward from the fastening portion 79 defines a fitting portion 82 that can be fitted to the attachment hole 92 of the case 90. An accommodation groove 72A is formed in the fitting portion 82 extending through the entire outer surface in the circumferential direction. The rubber ring 72 is fitted to the accommodation groove 72A. When the fitting portion 82 of the device-side connector 70 is fitted to the attachment hole 92, the rubber ring 72 comes into close contact with the entire wall surface of the attachment hole 92 and prevents the entrance of water between the outer surface of the device-side connector housing 71 and the inner surface of the case 90.

Figure 7:
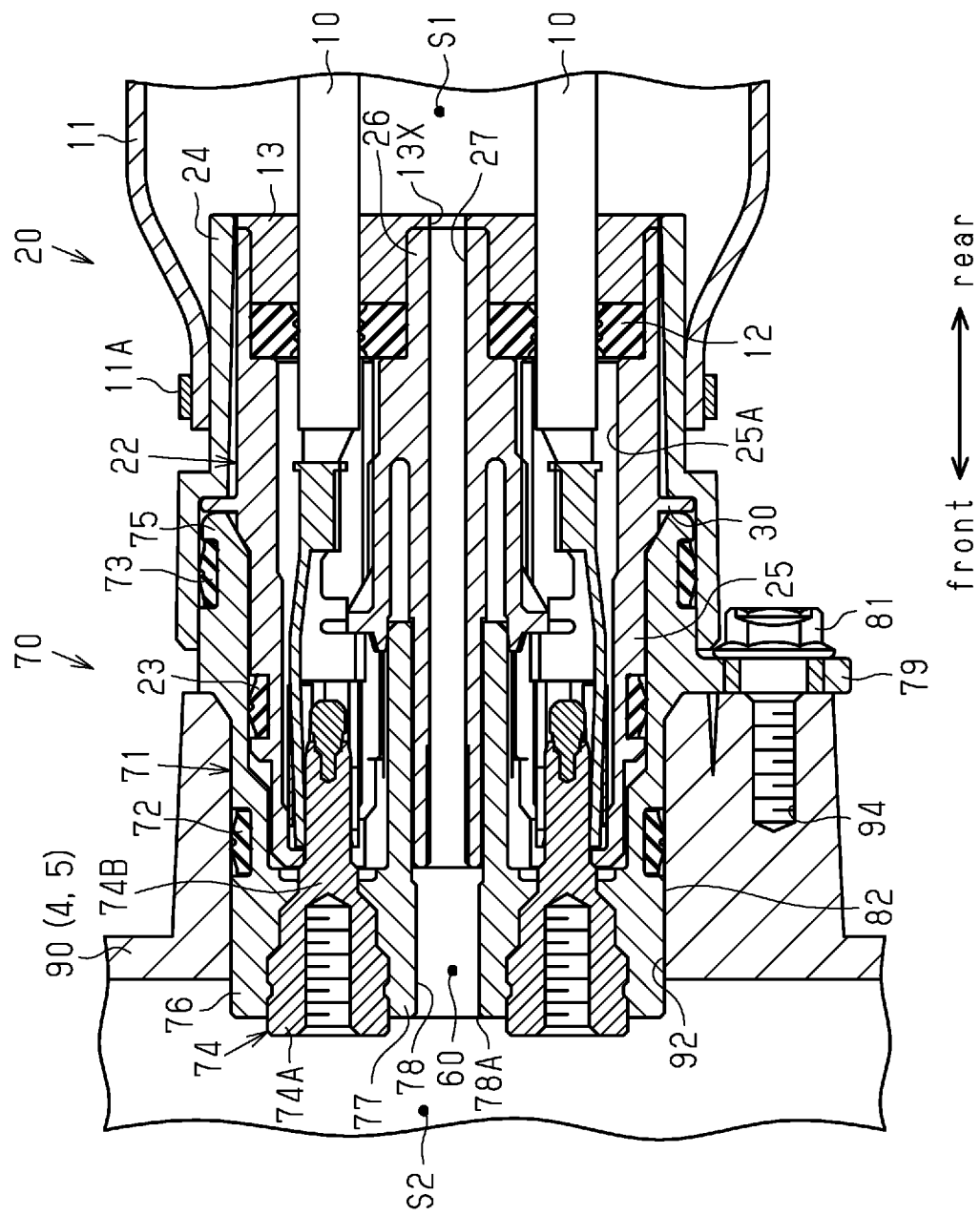
FIG. 7 is a cross-sectional view of the wire-side connector and the device-side connector in accordance with the first embodiment.

The portion of the hood 75 rearward from the fastening portion 79 is formed to allow for fitting inside the shield shell 24 of the wire-side connector 20. As shown in FIG. 7, when the wire-side connector 20 and the device-side connector 70 are finally fitted to each other, the part of the wire-side connector housing 22 (tubular accommodation portions 25 and tubular portion 26) frontward from the flange 30 is accommodated inside the hood 75. In this state, the rubber ring 23 fitted to the outer surface of the wire-side connector housing 22 comes into close contact with the entire inner surface of the hood 75 and prevents the entrance of water between the inner surface of the hood 75 and the outer surface of the wire-side connector housing 22.

As shown in FIGS. 4 and 5, an accommodation groove 73A is formed rearward from the fastening portion 79 in the hood 75 extending through the entire outer surface in the circumferential direction. The rubber ring 73 is fitted to the accommodation groove 73A. As shown in FIG. 7, when the wire-side connector 20 and the device-side connector 70 are finally fitted to each other, the rubber ring 73 comes into close contact with the entire inner surface of the shield shell 24 in the circumferential direction and prevents the entrance of water between the outer surface of the hood 75 and the inner surface of the shield shell 24.

As shown in FIG. 5, the terminal holder 76 is arranged on the inner wall of the hood 75. The male terminal metal fittings 74 are fixed to the terminal holder 76. The male terminal metal fittings 74 are formed, for example, sandwiching the tubular portion 77 in between. The male terminal metal fittings 74 each include a generally conical terminal body portion 74A and a pin-shaped connecting portion 74B that extends from the terminal body portion 74A toward the opening of the hood 75.

The pin-shaped connecting portion 74B projects from the inner wall of the hood 75 toward the opening of the hood 75 and extends to the substantially central portion of the hood 75 in the front-rear direction. The pin-shaped connecting portions 74B are formed to be insertable into the tubular connection portions 21A in the female terminal metal fittings 21 of the wire-side connector 20. As a result, when the wire-side connector 20 and the device-side connector 70 are finally fitted to each other, the pin-shaped connecting portions 74B are accommodated in the tubular connection portions 21A, and the male terminal metal fittings 74 are electrically connected to the female terminal metal fittings 21.

The tubular portion 77 has a hollow interior and includes two open ends. The tubular portion 77 has, for example, the form of a substantially square tube. The tubular portion 77 is located at a position opposing the tubular portion 26 of the wire-side connector housing 22. The tubular portion 77 extends in, for example, the front-rear direction. The tubular portion 77 extends, for example, rearward from the front end of the device-side connector housing 71 and projects rearward from the inner wall of the hood 75. The tubular portion 77 of the present example includes an end 77A at the side of the inner space S1 of the protective tube 11 (rear side) that is located toward the inner space S1 (rearward) from distal ends of the male terminal metal fittings 74.

The through hole 78 extends in the front-rear direction inside the tubular portion 77. The through hole 78 extends from the inner space S2 of the case 90 toward the inner space S1 of the protective tube 11. The through hole 78 has one end that is open toward the inner space S2 of the case 90 and another end that is open toward the through hole 27 of the wire-side connector 20. The through hole 78 is connected to the inner space S2 of the case 90. The through hole 78 extends through, for example, the device-side connector housing 71 in the front-rear direction. The through hole 78 has the form of, for example, a substantially square post. The through hole 78 of the present example is formed so that an open end 78A at a device side, specifically, the side of the inner space S2 of the case 90 (front side) is located toward the inner space S2 (frontward) from the rubber ring 72.

The through hole 78 has a larger contour than the tubular portion 26. Thus, as shown in FIG. 7, when the wire-side connector housing 22 is fitted to the device-side connector housing 71, the tubular portion 77 is fitted onto the tubular portion 26. The tubular portion 77 is formed so that, for example, its inner surface slides in contact with the outer surface of the tubular portion 26 when fitted onto the tubular portion 26. Further, when the tubular portion 77 is fitted onto the tubular portion 26, the through hole 78 is connected to the through hole 27 of the wire-side connector housing 22. As a result, the through holes 27 and 78 form the ventilation passage 60, which connects the inner space S1 of the protective tube 11 and the inner space S2 of the case 90, inside the wire-side connector 20 and inside the device-side connector 70. The ventilation passage 60 has one end that opens and connects to the inner space S1 of the protective tube 11 and another open end that opens and connects to the inner space S2 of the case 90. The ventilation passage 60 does not open at locations other than the inner spaces S1 and S2. That is, the ventilation passage 60 is connected to only the inner spaces S1 and S2 and is not connected to space outside the wire-side connector 20 and the device-side connector 70. Thus, the ventilation passage 60 is not directly exposed to, for example, the outside of the protective tube 11. Further, the ventilation passage 60 of the present example includes the through holes 27 and 78 and the through hole 13X, which is formed in the retainer 13.

Figure 6:
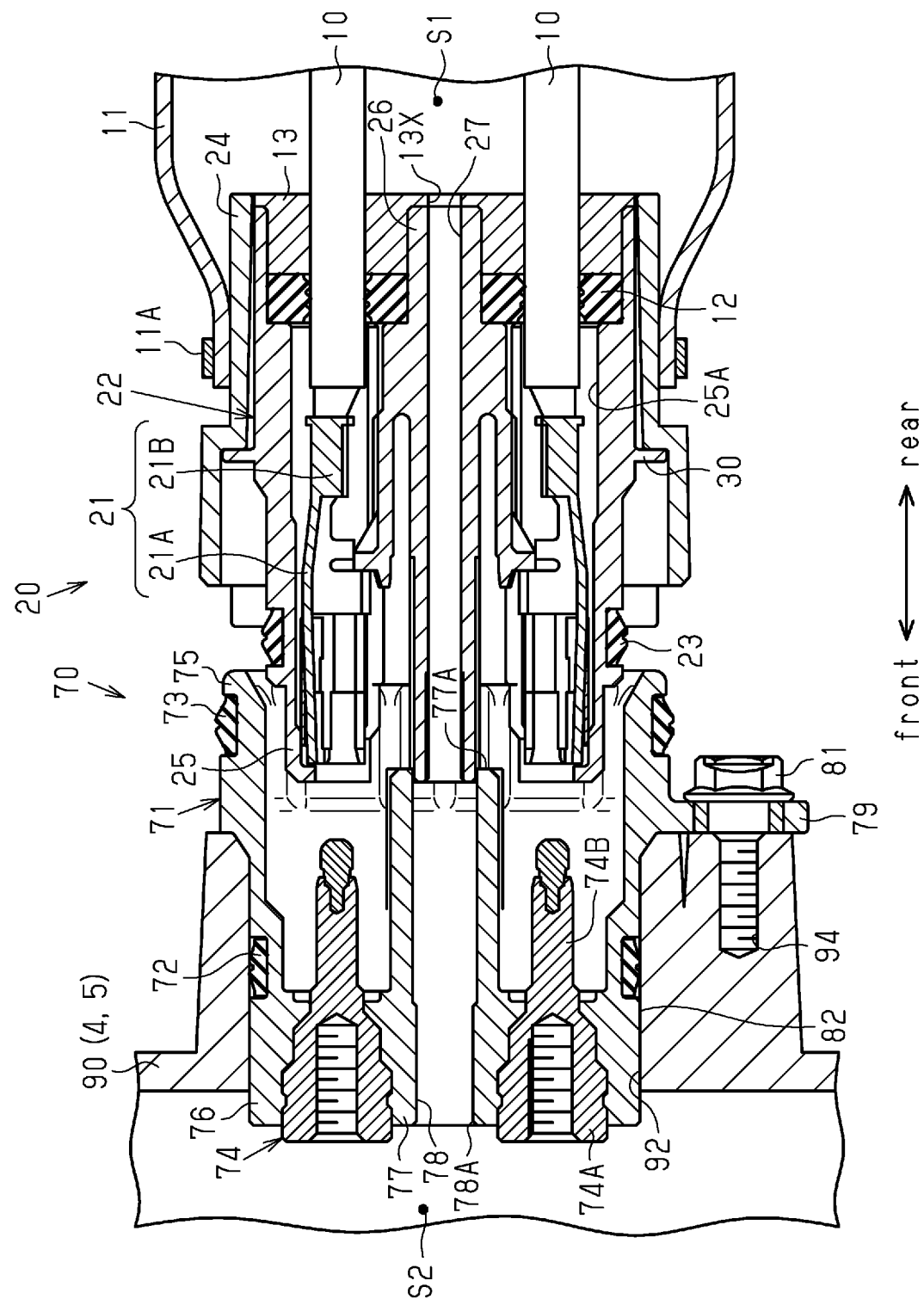
FIG. 6 is a cross-sectional view of the wire-side connector and the device-side connector in accordance with the first embodiment.

With reference to FIGS. 5 to 7, an attachment method of a connector (device connector) formed by the wire-side connector 20 and the device-side connector 70 will now be described.

First, as shown in FIG. 5, the wire-side connector 20 is prepared connected to the terminal ends of the electric wires 10, with the protective tube 11 attached to the outer surface of the shield shell 24. Further, the fitting portion 82 of the device-side connector housing 71 is fitted to the attachment hole 92 of the case 90. Then, the fastening bolt 81 is inserted through the bolt insertion hole 79X in the fastening portion 79 of the device-side connector housing 71 and fastened to the bolt fastening hole 94 of the case 90 to fix the device-side connector 70 to the case 90.

As shown in FIG. 6, the wire-side connector 20 is slightly fitted to the device-side connector 70, which is fixed to the case 90. In this state, in the present embodiment, the tubular portion 77 of the device-side connector 70 is fitted onto the tubular portion 26 of the wire-side connector 20 before the male terminal metal fittings 74 of the device-side connector 70 are fitted into the tubular accommodation portions 25 of the wire-side connectors 20. The tubular portion 26 and the tubular portion 77 function as a guide mechanism and restrict the angle of insertion of the male terminal metal fittings 74 into the tubular accommodation portions 25 thereby avoiding damage to the male terminal metal fittings 74 and the female terminal metal fittings 21. Further, the tubular portion 77 is fitted onto the tubular portion 26. Thus, movement of the wire-side connector housing 22 is restricted in a direction orthogonal to the fitting direction. This restricts displacement of the wire-side connector housing 22 and the device-side connector housing 71 from the fitting position. Further, in the present embodiment, the tubular portion 77 and the tubular portion 26 both have forms of substantially square tubes, and the outer surface of the tubular portion 26 slides in contact with the inner surface of the tubular portion 77. This restricts rotation of the wire-side connector housing 22 about an axis extending in the fitting direction.

Next, as shown in FIG. 7, the device-side connector 70 is fully fitted to the wire-side connector 20. Then, the fastening bolt 42 (refer to FIG. 2) is fastened to the bolt fastening hole (not shown) of the case 90 to finally fit the wire-side connector 20 and the device-side connector 70 to each other. When the wire-side connector 20 and the device-side connector 70 are finally fitted to each other, the tubular portion 77 is fitted onto the tubular portion 26, and the through hole 27 is connected to the through hole 78. Further, the through hole 27 and the through hole 78 form the ventilation passage 60, which connects the inner space S1 of the protective tube 11 and the inner space S2 of the case 90, inside the wire-side connector 20 and the device-side connectors 70. Consequently, when the temperature increases inside the protective tube 11, the air inside the protective tube 11 is released into the inner space S2 of the case 90 to limit increases in the pressure inside the protective tube 11. Further, the ventilation passage 60 is formed inside the wire-side connector 20 and the device-side connector 70. Thus, the ventilation passage 60 is not directly exposed to the outside of the protective tube 11. This avoids situations in which the ventilation passage 60 is clogged by flying objects when the vehicle is traveling.

The present embodiment has the advantages described below.

(1) When the wire-side connector 20 and the device-side connector 70 are finally fitted to each other, the through hole 27 and the through hole 78 form the ventilation passage 60, which connects the inner space S1 of the protective tube 11 and the inner space S2 of the case 90, inside the wire-side connector 20 and the device-side connector 70. With this structure, even if the temperature increases in the protective tube 11, the air inside the protective tube 11 is released into the inner space S2 of the case 90. This enlarges the space into which the air in the protective tube 11 can be diffused. Thus, increases in the pressure inside the protective tube 11 can be limited. Further, the ventilation passage 60 is formed inside the wire-side connector 20 and the device-side connector 70. This avoids situations in which the ventilation passage 60 is clogged by flying objects when the vehicle is traveling or dust that is suspended in the air. Accordingly, increases in the pressure inside the protective tube 11 can be limited in a preferred manner.

(2) The rubber ring 23 is fitted onto the outer surface of the wire-side connector housing 22. The rubber ring 23 is entirely in close contact in the circumferential direction with the inner surface of the hood 75 of the device-side connector housing 71. With this structure, the rubber ring 23 prevents the entrance of water between the outer surface of the wire-side connector housing 22 and the inner surface of the hood 75 of the device-side connector housing 71. Further, in the present embodiment, the open end 27A at the rear side of the through hole 27 is located rearward from the rubber ring 23. With this structure, the through hole 27 and the through hole 78 connect the inner space S1 of the protective tube 11 and the inner space S2 of the case 90, while the rubber ring 23 prevents the entrance of water between the outer surface of the wire-side connector housing 22 and the inner surface of the hood 75 of the device-side connector housing 71. Accordingly, increases in the pressure inside the protective tube 11 are limited, while water resistance is maintained at the portion where the wire-side connector 20 and the device-side connector 70 are fitted to each other.

(3) The rubber ring 72, which is entirely in close contact in the circumferential direction with the wall surface of the attachment hole 92 of the case 90, is fitted onto the outer surface of the device-side connector housing 71. With this structure, the rubber ring 72 prevents the entrance of water between the outer surface of the device-side connector housing 71 and the wall surface of the attachment hole 92. Further, the open end 78A at the front side of the through hole 78 is located frontward from the rubber ring 72. With this structure, the through hole 27 and the through hole 78 connect the inner space S1 of the protective tube 11 and the inner space S2 of the case 90, while the rubber ring 72 prevents the entrance of water between the outer surface of the device-side connector housing 71 and the wall surface of the attachment hole 92 in the case 90. Accordingly, increases in the pressure inside the protective tube 11 are limited, while water resistance is maintained at the portion where the device-side connector 70 and the case 90 are fitted to each other.

(4) The wire-side connector housing 22 includes the tubular portion 26 and the through hole 27 that are separate and independent from the tubular accommodation portions 25 accommodating the electric wires 10. With this structure, even when the portions where the rubber plugs 12 are fitted onto the electric wires 10, which are fitted into the female terminal metal fittings 21, are water resistant, the through hole 27 and the through hole 78 connect the inner space S1 of the protective tube 11 and the inner space S2 of the case 90. Accordingly, increases in the pressure inside the protective tube 11 are limited, while water resistance is maintained at the portion where the female terminal metal fittings 21 are fitted.

(5) The open end of the through hole 27 has a smaller cross-sectional area than the cross-sectional area of the open end of the cavity 25A in each tubular accommodation portion 25. With this structure, even when the through hole 27 is provided separately from the tubular accommodation portions 25, enlargement of the wire-side connector housing 22 is limited.

(6) The tubular portion 77 is fitted onto the tubular portion 26 when the wire-side connector 20 and the device-side connector 70 are connected to each other. With this structure, when the wire-side connector 20 and the device-side connector 70 are fitted to each other, movement of the wire-side connector housing 22 is restricted in a direction orthogonal to the fitting direction. This restricts shifting of the fitting position when the wire-side connector 20 and the device-side connector 70 are finally fitted to each other.

(7) The tubular portion 26 and the tubular portion 77 both have the form of a substantially square tube. With this structure, when the tubular portion 77 is fitted onto the tubular portion 26, the substantially square outer wall of the tubular portion 26 and the substantially square inner wall of the tubular portion 77 are fitted to each other. Thus, when the wire-side connector 20 and the device-side connector 70 are fitted to each other, movement of the wire-side connector housing 22 is restricted about an axis extending in the fitting direction. This restricts shifting of the fitting position when the wire-side connector 20 and the device-side connector 70 are finally fitted to each other.

(8) The tubular portion 77 extends rearward from the inner wall of the hood 75 and projects rearward from the distal end of each male terminal metal fitting 74. With this structure, when the wire-side connector 20 and the device-side connector 70 are connected to each other, the tubular portion 77 is fitted onto the tubular portion 26 before the male terminal metal fittings 74 are inserted into the tubular accommodation portions 25. Thus, when the wire-side connector 20 and the device-side connectors 70 are fitted to each other, the tubular portion 26 and the tubular portion 77 function as a guide and restrict the angle at which the male terminal metal fittings 74 are inserted into the tubular accommodation portions 25. Accordingly, when the wire-side connector 20 and the device-side connector 70 are fitted to each other, damage to the male terminal metal fittings 74 and the female terminal metal fittings 21 is avoided.

(9) The conduction path 1 includes the electric wires 10, the protective tube 11, the wire-side connectors 20, and the device-side connectors 70. With this structure, the air warmed by the heat generated when the electric wires 10 are energized inside the protective tube 11 is released through the ventilation passage 60 into the case 90. This enlarges the space in which the air inside the protective tube 11 can be diffused and thereby reduces the heat trapped inside the protective tube 11. Accordingly, heat dissipation of the conduction path 1 is improved, and increases in the temperature of the entire conduction path 1 are limited.

Figure 8:
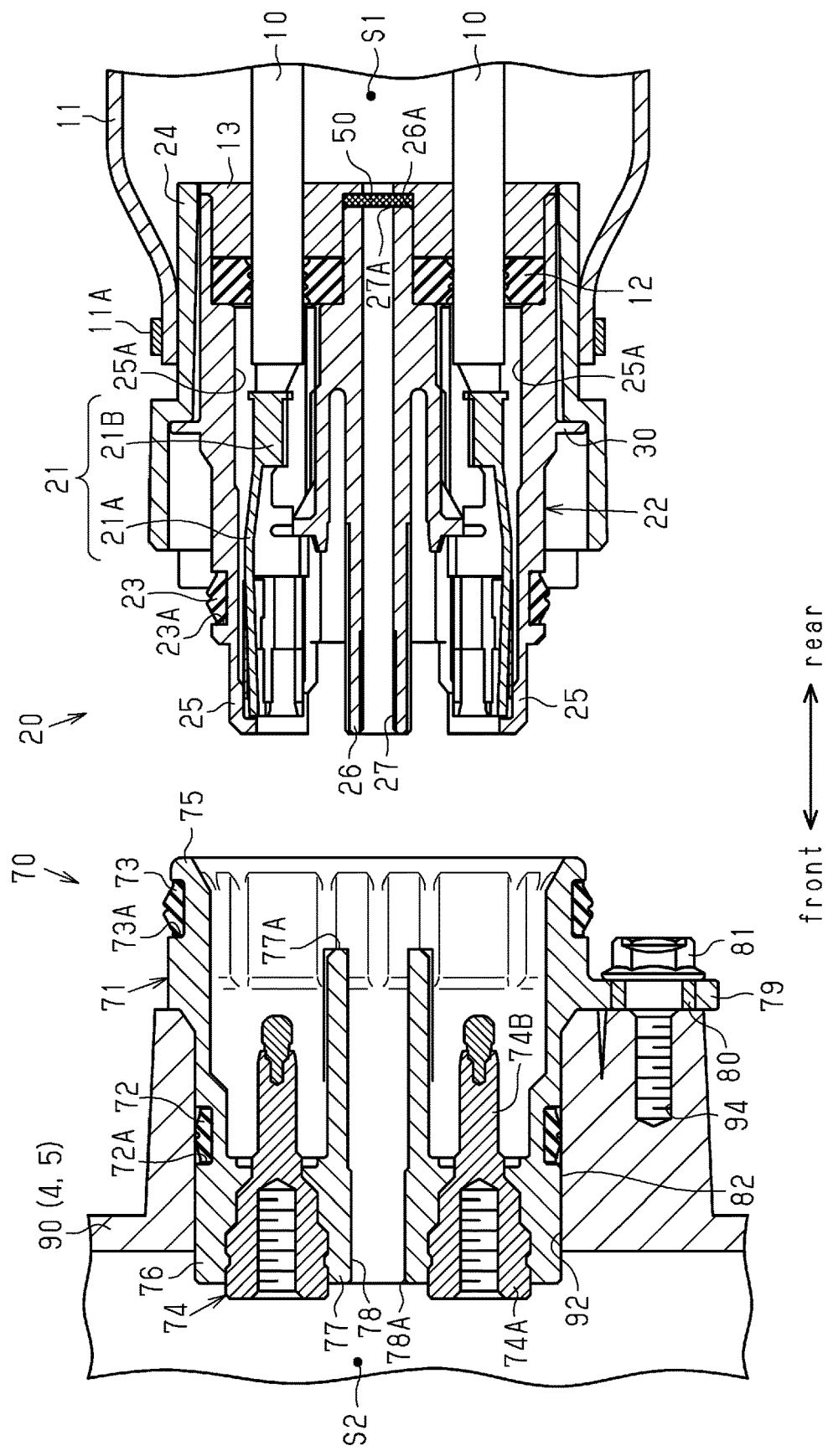
FIG. 8 is a cross-sectional view of a wire-side connector and a device-side connector in accordance with a second embodiment.

A second embodiment in accordance with the present invention will now be described with reference to FIG. 8. The present embodiment differs from the first embodiment in that a ventilation film 50 is arranged in the ventilation passage 60. Otherwise, the structure is the same as the first embodiment. Thus, same reference numerals are given to those components that are the same as the corresponding components of the first embodiment. The structure, operation, and effect of such components will not be described.

The ventilation film 50 closes the ventilation passage 60. The ventilation film 50, for example, closes the through hole 27. For example, the ventilation film 50 is arranged on a rear end surface 26A of the tubular portion 26 to close the open end 27A of the through hole 27 at the side of the inner space S1 of the protective tube 11 (rear side).

The ventilation film 50 is, for example, molded integrally with the wire-side connector housing 22. The method for fixing the ventilation film 50 to the wire-side connector housing 22 is not particularly limited as long as it is fixed in a watertight manner. For example, the ventilation film 50 may be fixed to the wire-side connector housing 22 by an adhesive agent.

The ventilation film 50 has a characteristic permitting the passage of gas and restricting the passage of liquid. The ventilation film 50 may be a porous resin film, a woven fabric, a non-woven fabric, a net, foam, or the like. For example, a ventilation film formed by a porous body of polytetrafluoroethylene (PTFE), which is a fluororesin, has high breathability and limits the entrance of foreign matter such as water and dust and is thus preferred. The ventilation film 50 restricts the passage of liquid so that liquid does not enter the through hole 27 even when water enters the inside of the protective tube 11.

The retainer 13 of the present example contacts part of the ventilation film 50. The retainer 13 contacts, for example, the outer edge of the ventilation film 50. The retainer 13 restricts separation of the ventilation film 50 from the tubular portion 26.

In addition to advantages (1) to (9) of the first embodiment, the above-described embodiment has the advantage described below.

(11) The ventilation film 50 closes the through hole 27. With this structure, the ventilation film 50 restricts the passage of liquid even when, for example, water enters the inside of the protective tube 11. Thus, liquid does not enter the through hole 27. Consequently, the entrance of liquid from the protective tube 11 into the case 90 through the ventilation passage 60 is limited. Accordingly, the water resistance of the device-side connector is improved, while limiting increases in the pressure inside the protective tube 11.

The above embodiments may be modified to the forms described below.

In the second embodiment, the ventilation film 50 is arranged on the rear end surface 26A of the tubular portion 26. However, as long as the entrance of water into the case 90 of a device can be restricted, the location of the ventilation film 50 is not particularly limited. For example, the ventilation film 50 can be arranged on the device-side connector housing 71 to close the front open end 78A of the through hole 78.

The ventilation film 50 of the second embodiment is a single layer. However, this is not a limitation. A further porous body, foam, woven fabric, non-woven fabric, net, mesh, or the like may be laminated as a reinforcement layer on the ventilation film 50.

In each of the above embodiments, the wire-side connector 20 includes the shield shell 24. However, this is not a limitation. The shield shell 24 can be provided when necessary, and the shield shell 24 can be omitted.

In each of the above embodiments, devices such as the inverter 4 and the high-voltage battery 5 include the case 90. However, this is not a limitation. The case 90 can be provided when necessary, and the case 90 can be omitted.

In each of the above embodiments, the through hole 27 is shaped to have the form of a substantially square post. However, this is not a limitation. The through hole 27 may be shaped to have the form of, for example, a substantially triangular post, a substantially pentagonal post, a substantially cylindrical post, or the like.

In each of the above embodiments, the through hole 27 is linear. However, this is not a limitation. For example, the through hole 27 may be non-linear (substantially L-shaped, substantially S-shaped, or the like).

In each of the above embodiments, the through hole 78 is shaped to have the form of a substantially square post. However, this is not a limitation. The through hole 78 may be shaped to have the form of, for example, a substantially triangular post, a substantially pentagonal post, a substantially cylindrical post, or the like.

In each of the above embodiments, the through hole 78 is linear. However, this is not a limitation. For example, the through hole 78 may be non-linear (substantially L-shaped, substantially S-shaped, or the like).

In each of the above embodiments, the wire-side connector housing 22 includes one through hole 27. However, this is not a limitation. For example, the wire-side connector housing 22 may include a plurality of through holes 27.

In each of the above embodiments, the device-side connector housing 71 includes one through hole 78. However, this is not a limitation. The device-side connector housing 71 may include a plurality of through holes 78.

In each of the above embodiments, the tubular portion 26 and the tubular portion 77 each have the form of a substantially square tube. However, this is not a limitation. For example, at least one of the tubular portion 26 and the tubular portion 77 may have the form of a substantially pentagonal tube, a substantially triangular tube, or a substantially cylindrical tube.

In each of the above embodiments, the tubular portion 77 is fitted onto the tubular portion 26. However, this is not a limitation. It is only necessary that the tubular portion 26 and the tubular portion 77 allow for connection of the inner space S1 of the protective tube 11 and the inner space S2 of the case 90. For example, the tubular portion 77 may be fitted into the tubular portion 26. The rear end surface of the tubular portion 77 may be in contact with the front end surface of the tubular portion 26. The rear end surface of the tubular portion 77 may be spaced apart from the front end surface of the tubular portion 26. In this case, for example, space that is separate from the through holes 27 and 78 extends between the tubular portion 26 and the tubular portion 77. The space and the through holes 27 and 78 connect the inner space S1 of the protective tube 11 and the inner space S2 of the case 90.

In each of the above embodiments, the through hole 27 is located at a position sandwiched between the tubular accommodation portions 25. However, this is not a limitation. The through hole 27 may be located at any position inside the wire-side connector housing 22.

Figure 9A:
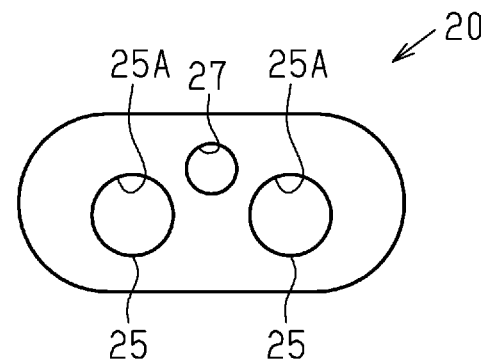
FIGS. 9A and 9B are plan views showing modified examples of wire-side connectors.

For example, as shown in FIG. 9A, the through hole 27 and the tubular accommodation portions 25 can be arranged in a zigzagged manner. More specifically, the tubular accommodation portions 25 may be arranged next to each other, and the through hole 27 may be located between the tubular accommodation portions 25 at a position shifted in a direction intersecting the direction in which the tubular accommodation portions 25 are arranged next to each other.

Figure 9B:
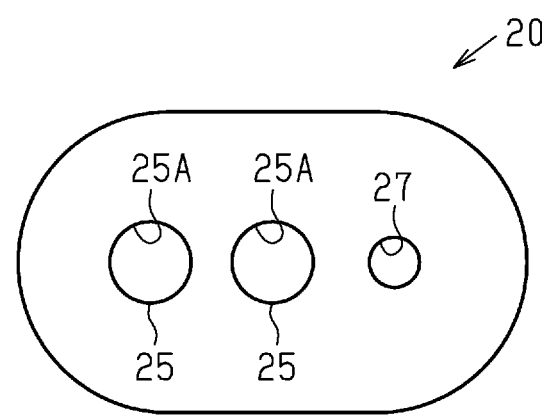

Further, for example, as shown in FIG. 9B, the through hole 27 may be located toward the outer side from the tubular accommodation portions 25. More specifically, the tubular accommodation portions 25 may be arranged next to each other, and the through hole 27 may be located toward the outer side from the tubular accommodation portions 25 in the direction in which the tubular accommodation portions 25 are arranged next to each other.

Alternatively, the through hole 27 may be located inside the tubular accommodation portions 25.

In each of the above embodiments, the through hole 78 is located at a position sandwiched between the male terminal metal fittings 74. However, this is not a limitation. As long as the inner space S1 of the protective tube 11 and the inner space S2 of the case 90 can be connected by the through hole 27 and the through hole 78, the through hole 78 may be located at any position inside the device-side connector housing 71.

In each of the above embodiments, the rear end 77A of the tubular portion 77 projects rearward from the distal end of each male terminal metal fitting 74. For example, the distal end of each male terminal metal fitting 74 may be projected rearward from the rear end 77A of the tubular portion 77.

In each of the above embodiments, the device-side connector 70 has a substantially oval contour and extends in the front-rear direction. However, this is not a limitation. For example, the device-side connector 70 may have a substantially circular or substantially square contour.

In each of the above embodiments, the electric wire 10 includes a conductive core wire and an insulative coating, which covers the outer surface of the core wire and is formed from a synthetic resin. However, this is not a limitation. For example, the electric wire 10 may be a shielded wire having a self-shielding function. Alternatively, the electric wire 10 may be a wire formed by connecting a rigid wire, of which shape can be maintained, and a flexible wire, which can be freely bent.

In each of the above embodiments, the number of electric wires 10 is not limited to two. The number of electric wires 10 may be changed in accordance with the specification of the vehicle. For example, the number of electric wires 10 may be one. Alternatively, the number of electric wires 10 may be three or more.

In each of the above embodiments, the wire-side connector 20 includes the female terminal metal fittings 21, and the device-side connector 70 includes the male terminal metal fittings 74. However, this is not a limitation. It is only necessary that the wire-side connector 20 and the device-side connector 70 be electrically connected when finally fitted to each other. For example, the wire-side connector 20 may include male terminal metal fittings, and the device-side connector 70 may include female terminal metal fittings.

In each of the above embodiments, the through hole 13X of the retainer 13 may be omitted. The retainer 13 only needs, for example, a gap that connects the through hole 27 and the inner space S1 of the protective tube 11.

In each of the above embodiments, the retainer 13 may be omitted.

In each of the above embodiments, the rubber plug 12 may be omitted.

Although not particularly described in the above embodiments, an electromagnetic shield member may be arranged inside the protective tube 11. The electromagnetic shield member, for example, surrounds all of the electric wires 10. The electromagnetic shield member is arranged, for example, between the inner surface of the protective tube 11 and the outer surfaces of the electric wires 10. For example, a flexible braided wire or metal foil may be used as the electromagnetic shield member.

Each of the above embodiments and modified examples may be combined.

It should be apparent to those skilled in the art that the present invention may be embodied in many other specific forms without departing from the spirit or scope of the invention. For example, some of the components described in the embodiments (one or more forms) may be omitted or combined. The scope of the present invention and equivalence of the present invention are to be understood with reference to the appended claims.

DESCRIPTION OF THE REFERENCE CHARACTERS 1 conduction path
2 wire harness
4 inverter (device)
5 high-voltage battery (device)
10 wire
11 protective tube
20 wire-side connector
22 wire-side connector housing
23 rubber ring (first seal member)
25 tubular accommodation portion
26 tubular portion (first tubular portion)
27 through hole (first through hole)
50 ventilation film
60 ventilation passage
70 device-side connector
71 device-side connector housing
72 rubber ring (second seal member)
73 rubber ring (third seal member)
74 male terminal metal fitting (terminal metal fitting)
75 hood
77 tubular portion (second tubular portion)
78 through hole (second through hole)
90 case
92 attachment hole
S1, S2 inner space

The invention claimed is:

1. A connector comprising:
a device-side connector attached to a device; and
a wire-side connector configured to be fitted to the device-side connector in a fitting direction and attached to a protective tube that protects a wire, wherein
the wire-side connector includes a tubular accommodation portion that accommodates the wire, a first tubular portion that is different from the tubular accommodation portion and that has two open ends and a first through hole forming an empty space extending between the two open ends of the first tubular portion in the fitting direction, and a shield shell that supports the first tubular portion at an inner side, the protective tube being fixed to an outer surface of the shield shell,
the device-side connector includes a second tubular portion that has two open ends and a second through hole forming an empty space extending between the two open ends of the second tubular portion in the fitting direction, and a hood that supports the second tubular portion at an inner side, and
when the wire-side connector and the device-side connector are finally fitted to each other, the first tubular portion of the wire-side connector is located at the inner side of the hood of the device-side connector, and a ventilation passage that connects an inner space of the device and an inner space of the protective tube through the first through hole and the second through hole is formed inside the wire-side connector and the device-side connector.

2. The connector according to claim 1, wherein
the hood of the device-side connector allows for accommodation of the wire-side connector,
a first seal member is fitted onto the wire-side connector to come in close contact with an inner surface of the hood when the wire-side connector and the device-side connector are finally fitted to each other, and
an open end of the first through hole at a side of the inner space of the protective tube is located toward the side of the inner space of the protective tube from the first seal member.

3. The connector according to claim 1, wherein
the device-side connector is fitted to an attachment hole of the device-side connector,
a second seal member is fitted onto the device-side connector to come in close contact with a wall surface of the attachment hole when the device-side connector is fitted to the attachment hole, and
an open end of the second through hole at a side of the inner space of the device is located toward the side of the inner space of the device from the second seal member.

4. The connector according to claim 1, wherein
the tubular accommodation portion has two open ends that are separated and independent from the first through hole of the first tubular portion.

5. The connector according to claim 4, wherein the first through hole has an open end with a smaller cross-sectional area than the open ends of the tubular accommodation portion.

6. The connector according to claim 1, wherein the first tubular portion is fitted onto or fitted into the second tubular portion when the wire-side connector and the device-side connector are finally fitted to each other.

7. The connector according to claim 6, wherein
the device-side connector includes a terminal metal fitting, and
an end of the second tubular portion at a side of the wire-side connector projects toward the wire-side connector from the terminal metal fitting.

8. The connector according to claim 6, wherein at least one of the first tubular portion and the second tubular portion has the form of a polygonal tube.

9. The connector according to claim 1, wherein the ventilation passage includes a ventilation film that permits passage of gas and restricts passage of liquid.

10. A conduction path comprising the electric wire, the protective tube, and the connector according to claim 1.

11. A connector comprising:
a device-side connector attached to a device; and
a wire-side connector attached to a protective tube that protects a wire, wherein
the wire-side connector includes a first tubular portion that has two open ends and a first through hole therein, and a shield shell that supports the first tubular portion at an inner side, the protective tube being fixed to an outer surface of the shield shell,
the device-side connector includes a second tubular portion that has two open ends and a second through hole therein, and a hood that supports the second tubular portion at an inner side,
when the wire-side connector and the device-side connector are finally fitted to each other, the first tubular portion of the wire-side connector is located at the inner side of the hood of the device-side connector, and a ventilation passage that connects an inner space of the device and an inner space of the protective tube through the first through hole and the second through hole is formed inside the wire-side connector and the device-side connector, and
the ventilation passage includes a ventilation film that permits passage of gas and restricts passage of liquid.

12. A connector comprising:
a device-side connector configured to be attached to a device; and
a wire-side connector configured to be fitted to the device-side connector in a linear fitting direction and configured to be attached to a protective tube that protects a wire, wherein
the wire-side connector includes a wire accommodation tube configured to accommodate an end of the wire and extending in the linear fitting direction in the wire-side connector, a first hollow ventilation tube extending parallel to the wire accommodation tube in the wire-side connector, and a shield shell which surrounds the wire accommodation tube and the first hollow ventilation tube and on which a longitudinal end of the protective tube is fixed to,
the device-side connector includes a second hollow ventilation tube extending in the linear fitting direction in the device-side connector, and a hood surrounding the second hollow ventilation tube, and
when the wire-side connector and the device-side connector are fitted to each other in the linear fitting direction, the first hollow ventilation tube of the wire-side connector and the second hollow ventilation tube of the device-side connector are coaxially connected to each other to form a ventilation passage that connects an inner space of the device and an inner space of the protective tube in the linear fitting direction to limit increase in a pressure inside the protective tube.

* * * * *